United States Patent
Guilford

(10) Patent No.: US 7,397,312 B2
(45) Date of Patent: Jul. 8, 2008

(54) SPECTRUM ANALYZER AND METHOD FOR CORRECTING FREQUENCY ERRORS

(75) Inventor: John H. Guilford, Stanwood, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 83 days.

(21) Appl. No.: 11/191,434

(22) Filed: Jul. 28, 2005

(65) Prior Publication Data

US 2007/0026830 A1 Feb. 1, 2007

(51) Int. Cl.
*H03L 7/00* (2006.01)
*H04B 7/00* (2006.01)

(52) U.S. Cl. .................. 331/17; 331/11; 455/260; 455/264

(58) Field of Classification Search ............ 331/11, 331/17; 455/260, 264
See application file for complete search history.

(56) References Cited

U.S. PATENT DOCUMENTS

| | | | |
|---|---|---|---|
| 4,727,591 A * | 2/1988 | Manlove ................ 455/182.2 |
| 5,283,532 A * | 2/1994 | Burkhart et al. ............ 329/360 |
| 5,440,313 A | 8/1995 | Osterdock et al. |
| 5,552,838 A * | 9/1996 | Suizu ........................ 348/735 |
| 5,717,403 A | 2/1998 | Nelson et al. |
| 5,737,715 A | 4/1998 | Deaton et al. |
| 5,745,741 A | 4/1998 | King |
| 5,757,786 A | 5/1998 | Joo |
| 5,777,464 A | 7/1998 | Takaoku et al. |
| 5,886,583 A | 3/1999 | Horiuchi |
| 6,563,387 B2 * | 5/2003 | Hirano et al. ................. 331/11 |
| 6,697,016 B1 | 2/2004 | Voor et al. |
| 6,741,842 B2 | 5/2004 | Goldberg et al. |
| 6,782,045 B1 | 8/2004 | Tanai |
| 6,856,791 B2 * | 2/2005 | Klemmer ..................... 455/76 |
| 7,064,621 B2 * | 6/2006 | Nakanishi .................... 331/57 |
| 2002/0094796 A1 * | 7/2002 | Woods et al. ................ 455/260 |

OTHER PUBLICATIONS

GB Search Report dated Oct. 18, 2006.

* cited by examiner

*Primary Examiner*—Robert Pascal
*Assistant Examiner*—Levi Gannon

(57) ABSTRACT

A spectrum analyzer corrects for internal frequency errors in a reference oscillator using a timing control signal. The reference oscillator provides a reference signal at a reference frequency. An error detection circuit determines an error in the reference frequency using the timing control signal and produces an error correction signal for use by a frequency conversion device in adjusting an output frequency thereof to compensate for the frequency error in the reference frequency.

20 Claims, 2 Drawing Sheets

SPECTRUM ANALYZER AND METHOD FOR CORRECTING FREQUENCY ERRORS

BACKGROUND OF THE INVENTION

Spectrum analyzers commonly contain a master or reference oscillator that generates a precise oscillation frequency to control the timing and measurement frequency of the analyzer. As such, the performance of spectrum analyzers may be significantly degraded by frequency errors in the reference oscillator. Typically, the reference oscillator is a crystal oscillator that provides a relatively stable oscillation frequency. However, crystal oscillators often exhibit thermal variation in the oscillation frequency. As a result, the oscillation frequency of a crystal oscillator may vary with ambient temperature. The amount of thermal instability is typically measured in parts per million and is used to specify the frequency precision of the crystal oscillator. From the frequency precision, the frequency error expected from the crystal oscillator can be determined.

As an example, a crystal oscillator with a nominal operating frequency of 10 MHz with a frequency precision of 1 part per million (ppm) has an expected frequency error of ±1 kHz. Although this frequency error is small in comparison to the nominal operating frequency, the error may be unacceptable in frequency sensitive applications. For example, when measuring narrowband signals using local oscillators whose frequencies are derived from the reference oscillator, a 1 kHz frequency error in the reference oscillator can significantly reduce the measurement accuracy of the spectrum analyzer.

There are a number of techniques currently available to correct frequency errors in the reference oscillator. One common technique is to lock the reference oscillator to a more accurate signal at the desired operating frequency (e.g., an externally-generated 10 MHz reference clock signal) to correct for any variations in the oscillation frequency. For example, the reference oscillator can be "locked" to the external signal by comparing the frequency of the reference oscillator to the frequency of the external signal to determine a frequency error or offset which is used to correct the reference oscillator frequency.

However, such automatic frequency correction (AFC) techniques require the reference oscillator to be adjustable (e.g., a voltage controlled oscillator), which increases the cost of the reference oscillator. Thus, in spectrum analyzers with inexpensive, fixed-frequency reference oscillators, frequency correction using available AFC techniques is not possible. In addition, spectrum analyzers may not have access to an external signal, and therefore, may not be able to correct the oscillation frequency of the reference oscillator. As a result, there is a need for a spectrum analyzer capable of correcting frequency errors in the reference oscillator without requiring the reference oscillator to lock to an accurate signal.

SUMMARY OF THE INVENTION

Embodiments of the present invention provide a spectrum analyzer that corrects for internal frequency errors using a timing control signal. The spectrum analyzer includes a reference oscillator for providing a reference signal at a reference frequency, and an error detection circuit for determining an error in the reference frequency using the timing control signal. The error detection circuit further produces an error correction signal for use by a frequency conversion device in adjusting an output frequency thereof to compensate for the frequency error in the reference frequency.

In one embodiment, the frequency conversion device includes a local oscillator connected to receive the reference signal and the error correction signal. The local oscillator converts the reference signal at the reference frequency to an operating signal at an operating frequency using the error correction signal. For example, in an exemplary embodiment, the local oscillator includes: (i) a phase and frequency detector that receives the reference signal and a feedback signal and produces an error signal indicative of a difference in phase or frequency between the reference signal and the feedback signal; (ii) a voltage generator that receives the error signal and the error correction signal and generates a control voltage proportional to a combination of the error signal and the error correction signal; and (iii) a voltage controlled oscillator that receives the control voltage and produces the operating signal based on the control voltage.

In another embodiment, the spectrum analyzer further includes an additional frequency conversion device that receives a radio frequency (RF) signal and a local oscillation signal produced from the reference signal and converts the RF signal to an intermediate frequency (IF) signal using the local oscillation signal, an analog-to-digital converter for converting the IF signal to a digital signal and a processor including the frequency conversion device for processing the digital signal using the error correction signal. For example, in an exemplary embodiment, the frequency conversion device includes a frequency adjustment module for adjusting the frequency of the digital signal as a function of the error correction signal to produce a corrected digital signal.

In a further embodiment, the timing control signal includes timing signals separated by known time intervals and the error detection circuit includes a counter circuit for counting cycles of the reference signal occurring between successive timing signals to produce a count value indicative of the reference frequency. The error detection circuit further includes a processor for determining the reference frequency from the count value, determining the error in the reference frequency as a difference between the reference frequency and a desired frequency and producing the error correction signal to compensate for the error in the reference frequency. For example, in an exemplary embodiment, the timing signals are pulses of a Global Positioning System (GPS) clock signal generated at a rate of one pulse per second.

In still a further embodiment, the error detection circuit includes a phase comparator for detecting a phase difference between the reference signal the said timing control signal and a processor for determining the reference frequency from the phase difference, determining the error in the reference frequency as a difference between the reference frequency and a desired frequency and producing the error correction signal to compensate for the error in the reference frequency.

BRIEF DESCRIPTION OF THE DRAWINGS

The disclosed invention will be described with reference to the accompanying drawings, which show exemplary embodiments of the invention and which are incorporated in the specification hereof by reference, wherein.

DETAILED DESCRIPTION OF THE EXEMPLARY EMBODIMENTS

Figure 1:
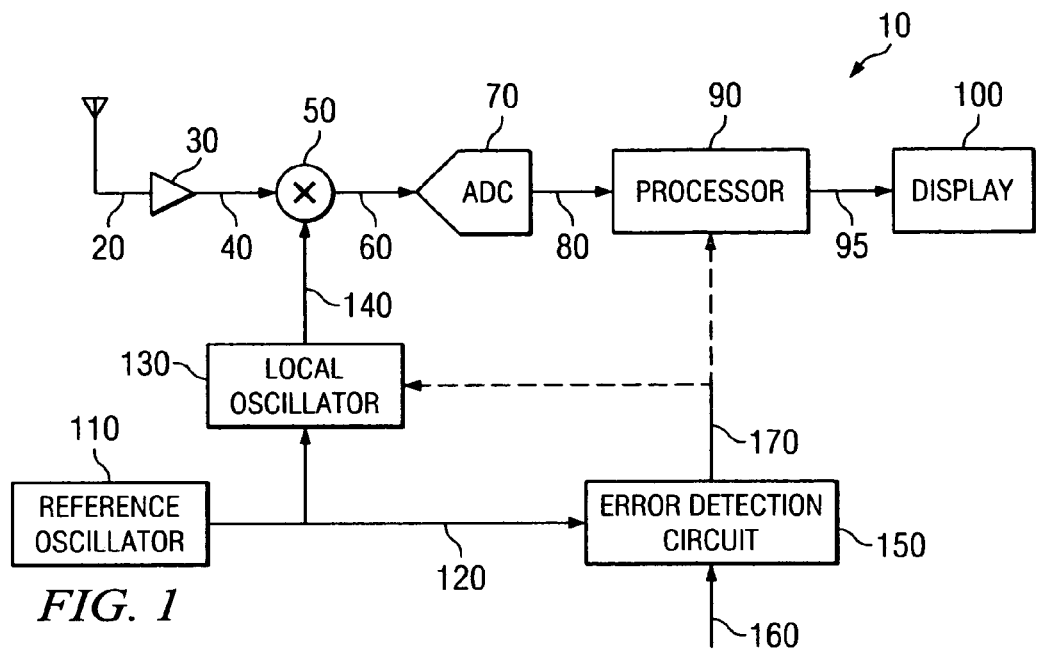
FIG. 1 is a schematic block diagram illustrating a spectrum analyzer, in accordance with embodiments of the present invention.

FIG. 1 is a schematic block diagram illustrating an exemplary and simplified spectrum analyzer 10, in accordance with embodiments of the present invention. For example, the spectrum analyzer 10 shown in FIG. 1 can represent exemplary components of an AGILENT TECHNOLOGIES, INC. model E4440 PSA series Spectrum Analyzer.

The spectrum analyzer 10 includes a low noise amplifier (LNA) 30, mixer 50, one or more local oscillators 130 (only one of which is shown for convenience), analog-to-digital converter 70, processor 90 and display 100. In operation, the LNA 30 amplifies an inbound RF signal 20 to produce an amplified inbound RF signal 30. The LNA 30 provides the amplified inbound RF signal 40 to the mixer 50, which directly converts the amplified inbound RF signal 40 into an inbound low IF signal 60 based on a local oscillation signal 140 provided by the local oscillator 130. The local oscillation signal 140 establishes the center frequency CF for the measurements performed by the spectrum analyzer 10.

The inbound low IF signal 60 is converted from analog to digital via the analog-to-digital converter 70 to produce a digital signal 80. The processor 90 processes the digital signal 80 and outputs display data 95 to the display 100 for display thereon. The processor 90, and more generally, as used herein, the term "processor" includes any type of processing device, such as a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operation of a conventional spectrum analyzer is described, for example, in Spectrum Analysis Basics, Application Note 150, provided by AGILENT TECHNOLOGIES, INC., Palo Alto, Calif., USA.

The spectrum analyzer 10 shown in FIG. 1 further includes a reference oscillator 110 and an error detection circuit 150. The reference oscillator 110 is a high precision oscillator, such as a crystal oscillator, that provides a reference signal 120 at a reference frequency (e.g., 10 MHz) to drive the local oscillator 130. The reference oscillator 110 and the local oscillator 130 can each include a voltage controlled oscillator or other oscillation device. The local oscillator 130 converts the reference signal 120 at the reference frequency to the local oscillation signal 140 at a measurement frequency (e.g., CF) of the spectrum analyzer 10. In an exemplary embodiment, the local oscillator 130 is a phase locked loop (PLL) frequency synthesizer of a translational loop, in which the IF frequency of the local oscillation signal 140 produced by the PLL frequency synthesizer is used to "translate" the inbound amplified signal 30 from RF to the desired IF frequency, using the mixer 50.

However, the frequency of the reference signal 120 produced by the reference oscillator 110 may drift from the specified or programmed oscillation frequency due to various factors, such as the ambient temperature. For example, although the specifications of the spectrum analyzer 10 may indicate that the center frequency of the reference oscillator 110 is 10 MHz, in operation, the actual center frequency may vary based on the frequency precision of the reference oscillator 110. Such frequency errors in the reference oscillator 110 can significantly reduce the measurement accuracy of the spectrum analyzer 10.

Therefore, in accordance with embodiments of the present invention, the error detection circuit 150 detects and corrects for reference oscillator frequency errors using a timing control signal 160 received or generated by the spectrum analyzer 10. The timing control signal 160 includes any type of accurate or precise signal. For example, in one embodiment, the timing control signal 160 is a Global Positioning System (GPS) clock signal generated by a GPS receiver (not shown) within the spectrum analyzer 10. GPS receivers are designed to receive GPS radio waves from a navigation satellite and provide a 1 pulse per second (pps) output synchronized to either GPS or UTC time. In other embodiments, the timing control signal 160 is an externally-generated precise signal, such as an IEEE 1588 Time Synchronization packet sent over a local area network (LAN).

The error detection circuit 150 receives both the reference signal 120 produced by the reference oscillator 110 and the timing control signal 160, and uses the timing control signal 160 to estimate the frequency error in the reference signal 120. For example, in one embodiment, the error detection circuit 150 determines the actual frequency of the reference signal 120 from the timing control signal 160 and compares the actual frequency to the desired frequency to estimate the frequency error in the reference signal 120, as described in more detail below in connection with FIG. 2. In another embodiment, the error detection circuit 150 detects a phase difference between the reference signal 120 and the timing control signal 160 to estimate the frequency error in the reference signal 120, as described in more detail below in connection with FIG. 3.

The error detection circuit 150 further produces an error correction signal 170 to the local oscillator 130 and/or processor 90 for use in correcting or otherwise compensating for the frequency error in the reference oscillator 110. For example, if the error detection circuit 150 determines that the reference oscillator 110 is 5.6 ppm slower than it should be, and the desired center frequency of the local oscillator 130 is 1.0 GHz, the error correction signal 170 provided to the local oscillator 130 can be used to program the local oscillator 130 to a center frequency 5.6 ppm higher than 1.0 GHz or 1.0000056 GHz. As a result, the actual center frequency produced by the local oscillator 130 would be the desired 1.0 GHz. As another example, the error correction signal 170 provided to the processor 90 can indicate the estimated frequency error. The processor 90 can use the estimated frequency error to post-process uncorrected measurement data received in the digital signal 80 to correct the measurement data for the incorrect center frequency.

Figure 2:
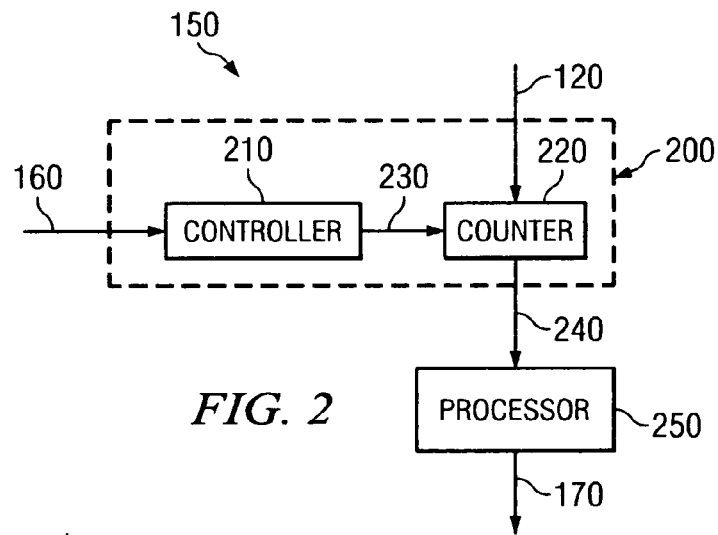
FIG. 2 is a block diagram of an exemplary error detection circuit for detecting frequency errors in a reference oscillator of the spectrum analyzer of FIG. 1, in accordance with embodiments of the present invention.

Referring now to FIG. 2, there is illustrated an exemplary error detection circuit 150 for detecting frequency errors in the reference oscillator of the spectrum analyzer of FIG. 1. The error detection circuit includes a counter circuit 200 and a processor 250. The counter circuit 200 is connected to receive both the timing control signal 160 and the reference signal 120 output from the reference oscillator. The counter circuit 200 is configured to count the number of cycles in the reference signal 120 occurring between each contiguous pair of pulses within the timing control signal 160. In one embodiment, each pair of timing pulses in the timing control signal 160 is separated by one GPS second. As a result, the number of counted cycles is equivalent to the average frequency over the counting interval of the reference signal 120.

In FIG. 2, the counter circuit 200 includes a counter 220 connected to receive the reference signal 120, and a controller 210 for controlling the counter 220 based on the timing control signal 160. Upon receipt of each timing pulse in the timing control signal 160, the controller 210 initiates a control signal 230 to the counter 220 that latches the number of cycles counted by the counter 220 since the previous timing pulse. The counter 220 outputs a count value 240 including the counted number of cycles (i.e., the measured frequency of the reference oscillator) to the processor 250, and the controller 210 resets the counter 220 after the count value 240 is output to restart the counting of the cycles in the reference signal 120.

The processor 250 determines the reference frequency of the reference signal 120 from the count value 240, and compares the measured reference frequency to a desired or specified frequency (e.g., user controlled frequency or programmed frequency) of the reference oscillator to determine the frequency error in the reference oscillator. From the frequency error, the processor 250 produces the error correction signal 170 to compensate for the error in the reference frequency. For example, in one embodiment, the error correction signal 170 indicates a center frequency to be programmed into the local oscillator to offset the error in the reference oscillator. As another example, the error correction signal 170 indicates the estimated frequency error to be used in subsequent processing of digital data captured by the spectrum analyzer to correct for the frequency error.

Figure 3:
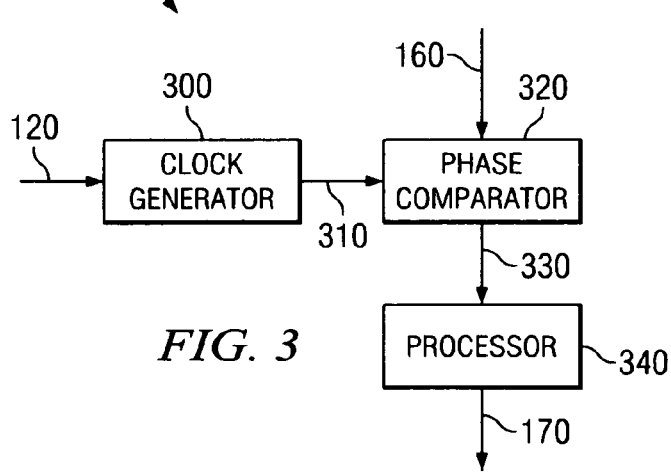
FIG. 3 is a block diagram of another exemplary error detection circuit, in accordance with embodiments of the present invention.

FIG. 3 is a block diagram of another exemplary error detection circuit 150, in accordance with embodiments of the present invention. The error detection circuit 150 includes a clock generator 300, phase comparator 320 and processor 340. The clock generator 300 is connected to receive the reference signal 120 from the reference oscillator. The clock generator 300 generates a square wave clock signal 310 and inputs the clock signal 310 to the phase comparator 320. In one embodiment, the clock generator 300 includes a counter circuit designed to count the number of cycles in the reference signal 120, and output a clock pulse once a predetermined number of cycles has been counted. For example, assuming the desired frequency of the reference signal 120 is "f," the clock generator 300 outputs one clock pulse each "f" number of cycles. Thus, when the reference frequency of the reference signal 120 is exactly "f" (i.e., there is no error in the reference signal 120), the clock generator 300 outputs one clock pulse each second.

The phase comparator 320 is connected to receive the timing control signal 160 and the clock signal 310. The phase comparator 320 is configured to compare the phases of the timing control signal 160 and the clock signal 310 and to output a phase difference signal 330 to the processor 340 with a pulse width indicative of the phase difference between the timing control signal 160 and the clock signal 310. In one embodiment, the timing control signal 160 is formed of timing pulses separated by one GPS second. The phase comparator 320 measures the difference in phase between a timing pulse in the timing control signal 160 and a corresponding clock pulse in the clock signal 310 to produce the phase difference signal 330.

In one embodiment, the processor 340 outputs the phase difference signal 330 directly as the error correction signal 170. In another embodiment, the processor 340 uses the phase difference signal 330 as the frequency error when generating the error correction signal 170. In a further embodiment, the processor 340 determines the actual reference frequency of the reference signal 120 from the phase difference signal 330, and compares the actual reference frequency to the desired frequency of the reference oscillator to determine the frequency error in the reference oscillator. From the frequency error, the processor 250 produces the error correction signal 170 to compensate for the error in the reference frequency. For example, in one embodiment, the error correction signal 170 indicates a center frequency to be programmed into the local oscillator to offset the error in the reference oscillator. As another example, the error correction signal 170 indicates the estimated frequency error to be used in subsequent processing of digital data captured by the spectrum analyzer to correct for the frequency error.

Figure 4:
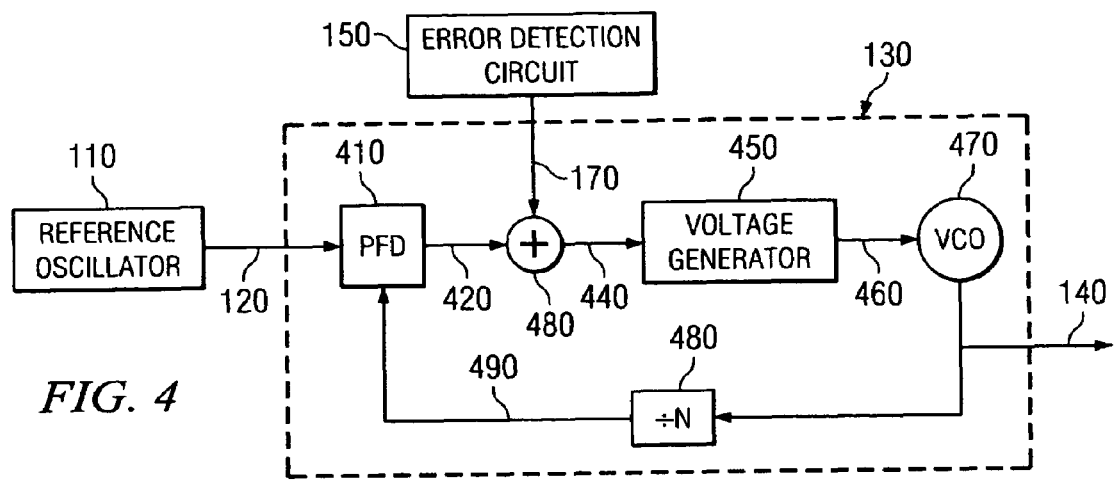
FIG. 4 is a schematic block diagram of an exemplary local oscillator of the spectrum analyzer providing an output that corrects for frequency errors in the reference oscillator, in accordance with embodiments of the present invention.

FIG. 4 is a schematic block diagram of an exemplary local oscillator 130 of the spectrum analyzer providing an output that corrects for frequency errors in the reference oscillator 110, in accordance with embodiments of the present invention. The local oscillator 130 is connected to receive both the reference signal 120 from the reference oscillator 110 and the error correction signal 170 from the error detection circuit 150. The local oscillator 130 includes a phase and frequency detector (PFD) 410, a summation node 430, a voltage generator 450, a voltage controlled oscillator (VCO) 470, and a frequency divider 480 in a feedback path that divides an output signal (i.e., local oscillation signal 140) of the VCO 470 by a divide ratio designed to produce a feedback signal 490 at a desired reference frequency.

In operation, the reference signal 120 and the feedback signal 490 are input to the PFD 410. The output of the PFD 410 is an error signal 420 indicative of the error (in phase and/or frequency) between the reference signal 120 and the feedback signal 490. The error signal 420 is combined with the error correction signal 170 at summation node 430 to produce a correction signal 440, which is input to the voltage generator 450. The voltage generator 450 generates an output voltage referred to as the "control voltage" 460 from the correction signal 440.

The oscillation frequency of the VCO 470 is determined by the control voltage 460. Therefore, the error correction signal 170 is set to produce a control voltage 460 that causes the oscillation frequency of the VCO 470 to compensate for the frequency error in the reference signal 120. The VCO 470 output is the local oscillation signal 140 output from the local oscillator 130, which is also input to the frequency divider 480 to produce the feedback signal 490 input to the PFD 410.

Figure 5:
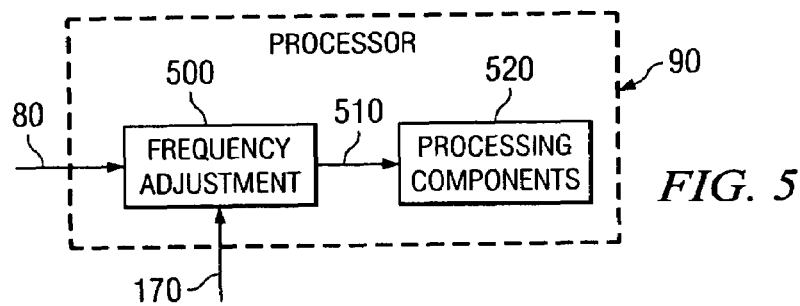
FIG. 5 is a schematic block diagram of an exemplary processor of the spectrum analyzer including a frequency adjustment component that corrects a digital signal for frequency errors in the reference oscillator, in accordance with embodiments of the present invention.

FIG. 5 is a schematic block diagram of an exemplary processor 90 of the spectrum analyzer for correcting for frequency errors in the reference oscillator, in accordance with embodiments of the present invention. The processor 90 includes a frequency adjustment processing component 500 and other processing components 520. The frequency adjustment processing component 500 is connected to receive the digital signal 80 output from the ADC and the error correction signal 170. The frequency adjustment processing component 500 adjusts the frequency of the digital signal based on the error correction signal 170 to produce a corrected digital signal 510. The corrected digital signal 510 is used in subsequent processing steps by other processing components 520 of the processor 90.

For example, in one embodiment, the error correction signal 170 provided to the frequency adjustment processing component 500 indicates the estimated frequency error of the reference oscillator. The frequency adjustment processing component 500 uses the estimated frequency error to correct data in the digital signal 80 to produce data with the appropriate frequency in the corrected digital signal 510. The error correction signal 170 can be applied to the frequency adjustment processing component 500 in real-time or can be stored in a memory (not shown) along with the data in the digital signal 510 for subsequent processing by the frequency adjustment processing component 500.

Figure 6:
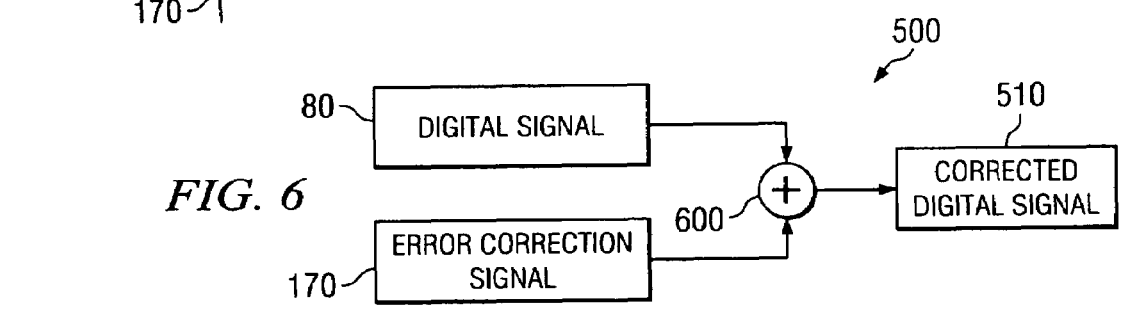
FIG. 6 is a schematic block diagram of an exemplary frequency adjustment component, in accordance with embodiments of the present invention.

FIG. 6 is a schematic block diagram of an exemplary frequency adjustment processing component 500, in accordance with embodiments of the present invention. The frequency adjustment processing component 500 includes a combining node 600 connected to receive the digital signal 80 and the error correction signal 170. The combining node 600 operates to combine the digital signal 80 with the error correction signal 170 (e.g., by addition, multiplication by an exponential signal and/or other mathematical combination) to produce the corrected digital signal 510. Thus, the error correction signal 170 includes a frequency offset designed to offset the frequency of the digital signal 510 to the desired frequency.

Figure 7:
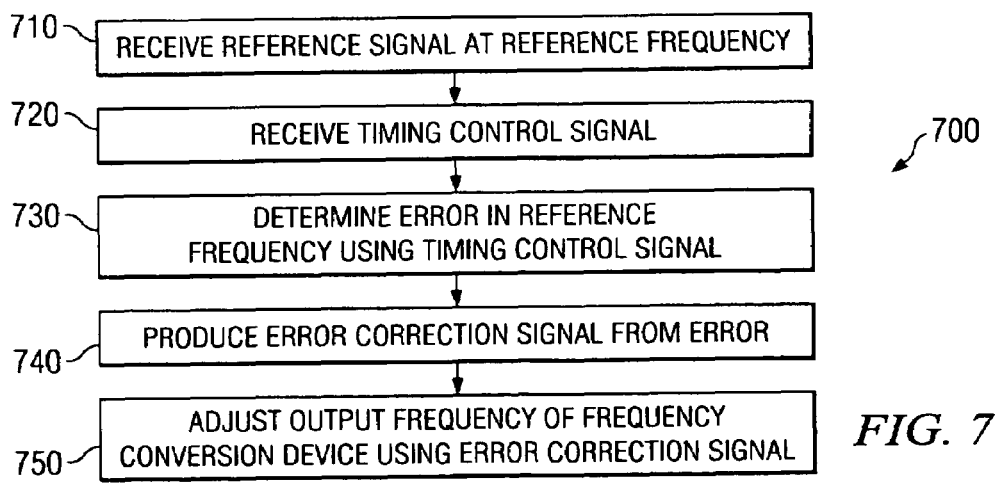
FIG. 7 illustrates an exemplary process for correcting frequency errors in a spectrum analyzer, in accordance with embodiments of the present invention.

FIG. 7 illustrates an exemplary process 700 for correcting frequency errors in a spectrum analyzer, in accordance with embodiments of the present invention. At block 710, a reference signal is produced by a reference oscillator of the spectrum analyzer at a reference frequency. At block 720, a timing control signal is received, and at block 730, the timing control signal is used to determine a frequency error in the reference frequency. For example, in one embodiment, the timing control signal is a GPS clock signal that is compared with the reference signal to determine phase and/or frequency differences therebetween. In one embodiment, the phase and/or frequency differences directly provide the frequency error. In another embodiment, the phase and/or frequency differences are used to determine the actual frequency of the reference signal, which can be compared to the desired frequency of the reference signal to determine the frequency error.

From the determined frequency error, an error correction signal is produced at block 740 for use in adjusting an output frequency of a frequency conversion device to compensate for the frequency error in the reference frequency at block 750. In one embodiment, the frequency conversion device is a local oscillator driven directly or indirectly by the reference oscillator. In another embodiment, the frequency conversion device is a digital processor configured to adjust the frequency of a digital data measured by the spectrum analyzer.

As will be recognized by those skilled in the art, the innovative concepts described in the present application can be modified and varied over a wide rage of applications. Accordingly, the scope of patents subject matter should not be limited to any of the specific exemplary teachings discussed, but is instead defined by the following claims.

I claim:

1. A spectrum analyzer, comprising:
   a reference oscillator for providing a reference signal at a reference frequency;
   an error detection circuit connected to receive said reference signal and a timing control signal and operable to determine an error in said reference frequency using said timing control signal and produce an error correction signal for use in correcting said error;
   a frequency conversion device connected to receive said error correction signal and said reference signal and is operable to produce an output frequency using said error correction signal to compensate for said error in said reference signal;
   an additional frequency conversion device connected to receive a radio frequency (RF) signal and a local oscillation signal produced from said reference signal and operable to convert said RF signal to an intermediate frequency (IF) signal using said local oscillation signal;
   an analog-to-digital converter connected to receive said IF signal and operable to convert said IF signal to a digital signal; and
   a processor including said frequency conversion device and connected to receive said digital signal and said error correction signal;
   wherein said processor is operable to process said digital signal using said error correction signal.

2. The spectrum analyzer of claim 1, wherein said frequency conversion device includes a local oscillator connected to receive said reference signal and said error correction signal, wherein said local oscillator is operable to convert said reference signal at said reference frequency to a local oscillation signal at a measurement frequency.

3. The spectrum analyzer of claim 2, wherein said local oscillator includes a voltage controlled oscillator connected to receive a control voltage produced from said error correction signal and operable to produce said local oscillation signal based on said control voltage.

4. The spectrum analyzer of claim 3, wherein said local oscillator further includes a phase and frequency detector connected to receive said reference signal and a feedback signal and operable to produce an error signal indicative of a difference in phase or frequency between said reference signal and said feedback signal, and a voltage generator connected to receive said error signal and said error correction signal and operable to generate said control voltage proportional to a combination of said error signal and said error correction signal.

5. The spectrum analyzer of claim 4, wherein said voltage controlled oscillator is further operable to produce said feedback signal as said local oscillation signal, and wherein said local oscillator further includes a frequency divider connected to receive said feedback signal and divide said feedback signal by a divide ration, and wherein said feedback signal generated by said voltage controlled oscillator is said local oscillation signal having said measurement frequency equal to the product of said reference frequency of said reference signal and said divide ratio.

6. The spectrum analyzer of claim 1, wherein said frequency conversion device includes a frequency adjustment component operable to adjust a frequency of said digital signal as a function of said error correction signal to produce a corrected digital signal.

7. The spectrum analyzer of claim 6, wherein said frequency adjustment component includes a summation node connected to combine said digital signal with said error correction signal to produce said corrected digital signal.

8. The spectrum analyzer of claim 1, wherein said timing control signal includes timing signals separated by known time intervals and wherein said error detection circuit includes:
   a counter circuit connected to receive said reference signal and operable to count cycles of said reference signal occurring between successive ones of said timing signals to produce a count value indicative of said reference frequency; and a processor connected to receive said count value and operable to determine said reference frequency from said count value, determine said error as a difference between said reference frequency and a desired frequency and produce said error correction signal to compensate for said error in said reference frequency.

9. The spectrum analyzer of claim 8, wherein said timing signals are pulses of a Global Positioning System (GPS) clock signal generated at a rate of one pulse per second.

10. The spectrum analyzer of claim 1, wherein said error detection circuit includes:
a phase comparator connected to receive said reference signal and said timing control signal and operable to detect a phase difference between said reference signal and said timing control signal; and
a processor connected to receive said phase difference and operable to determine said error from said phase difference and produce said error correction signal to compensate for said error in said reference frequency.

11. The spectrum analyzer of claim 1, further comprising:
an inbound signal processing portion connected to receive said output frequency signal, said inbound signal processing portion operable for using said output frequency to support frequency spectrum analysis of an inbound signal.

12. A method for correcting frequency errors in a spectrum analyzer, said method comprising:
receiving a reference signal at a reference frequency;
determining an error in said reference frequency using a timing control signal;
producing an error correction signal for use in correction said error;
producing an output frequency by a frequency conversion device that uses said error correction signal and said reference signal to compensate for said error in said reference signal;
receiving a radio frequency (RF) signal;
converting said RF signal to an intermediate frequency (IF) signal using a local oscillation signal produced from said reference signal;
converting said IF signal to a digital signal; and
processing said digital signal using said error correction signal.

13. The method of claim 12, further comprising:
converting said reference signal at said reference frequency to a local oscillation signal at a measurement frequency.

14. The method of claim 13, wherein said converting further comprises:
producing a control voltage from said error correction signal; and
producing said local oscillation signal based on said control voltage.

15. The method of claim 14, wherein said producing said control voltage further includes:
receiving said reference signal and a feedback signal produced from said local oscillation signal;
producing an error signal indicative of a difference in phase or frequency between said reference signal and said feedback signal; and
generating said control voltage proportional to a combination of said error signal and said error correction signal.

16. The method of claim 13, further comprising:
receiving a radio frequency (RF) signal; and
convening said RF signal to an intermediate frequency (IF) signal using said local oscillation signal.

17. The method of claim 12, wherein said processing further includes:
adjusting a frequency of said digital signal as a function of said error correction signal to produce a corrected digital signal.

18. The method of claim 12, wherein said timing control signal includes timing signals separated by known time intervals and wherein said producing said error correction signal further includes:
counting cycles of said reference signal occurring between successive ones of said timing signals to produce a count value indicative of said reference frequency;
determining said reference frequency from said count value;
determining said error as a difference between said reference frequency and a desired frequency; and
producing said error correction signal to compensate for said error in said reference frequency.

19. The method of claim 12, wherein said producing said error correction signal further includes:
detecting a phase difference between said reference signal and said timing control signal;
determining said error from said phase difference; and
producing said error correction to signal to compensate for said error in said reference frequency.

20. The method of claim 9, further comprising:
using said output frequency to support frequency spectrum analysis of an inbound signal.

* * * * *

UNITED STATES PATENT AND TRADEMARK OFFICE
CERTIFICATE OF CORRECTION

| | | |
|---|---|---|
| PATENT NO. | : 7,397,312 B2 | Page 1 of 1 |
| APPLICATION NO. | : 11/191434 | |
| DATED | : July 8, 2008 | |
| INVENTOR(S) | : Guilford | |

It is certified that error appears in the above-identified patent and that said Letters Patent is hereby corrected as shown below:

In column 10, line 18, in Claim 16, delete "convening" and insert -- converting --, therefor.

Signed and Sealed this

Seventh Day of October, 2008

JON W. DUDAS
*Director of the United States Patent and Trademark Office*